United States Patent [19]

DaSilva et al.

[11] Patent Number: 4,546,331
[45] Date of Patent: Oct. 8, 1985

[54] FREQUENCY MODULATION IN A PHASE-LOCKED LOOP

[75] Inventors: Marcus K. DaSilva, Spokane; David P. Whipple; Robert E. Temple, both of Greenacres, all of Wash.

[73] Assignee: Hewlett-Packard Company, Palo Alto, Calif.

[21] Appl. No.: 581,767

[22] Filed: Feb. 21, 1984

[51] Int. Cl.$^4$ ............................................. H03C 3/00
[52] U.S. Cl. .................................. 332/19; 332/23 R; 455/113
[58] Field of Search .............. 332/18, 19, 23 R, 30 V; 455/113, 119

[56] References Cited

U.S. PATENT DOCUMENTS 4,052,672 10/1977 Enderby et al. ................. 455/113 X

FOREIGN PATENT DOCUMENTS

1035776 8/1983 U.S.S.R. ................................ 332/19

Primary Examiner—Eugene R. LaRoche
Assistant Examiner—Robert J. Pascal
Attorney, Agent, or Firm—Leslie G. Murray

[57] ABSTRACT

Apparatus is provided to frequency modulate (FM) RF carrier frequencies generated in a phase-locked loop (PLL). FM outside the loop bandwidth is AC coupled to the loop. FM within the loop bandwidth is DC coupled via an integrating OP-AMP to provide phase modulation. Whenever the output of the integrator exceeds a preset threshold, a prescaler removes or adds two pi (or integral multiples of two pi) radians of phase change from the input to the loop divide-by-N circuit. At the same time, a current source pumps charge into the integrator to exactly compensate for the amount of phase removed or added resetting the integrator. DC feedback around the integrating OP-AMP and a feedback signal proportional to the exact amount of phase added or removed provides a true synthesized loop center frequency with no drift. When the feedback path is interrupted, DC FM is provided.

9 Claims, 6 Drawing Figures

FREQUENCY MODULATION IN A PHASE-LOCKED LOOP

BACKGROUND OF THE INVENTION

1. Field of Invention

The invention relates generally to frequency modulation of an RF carrier and more particularly to frequency modulation of a synthesized carrier generated by a phase-locked loop.

2. Description of Prior Art

It is well known in the art to synthesize frequencies by means of phase-locked loop circuits. The phase-locked loop (PLL) includes a tunable oscillator (typically a voltage-controlled oscillator (VCO)) whose output is locked to a known reference signal by means of a phase comparator. The phase comparator generates an output voltage or current that is proportional to the phase difference between the two signals. The phase comparator output is fed back to the input of the VCO and used to tune the VCO. This forces the VCO output to have exactly the same frequency as the reference signal. By interposing a divide-by-N block in the circuit the reference frequency may instead be compared with the VCO frequency divided by N; the VCO output will then be locked to N times the reference frequency. By varying N, it is possible to generate frequencies which are the Nth harmonics of the reference frequency, where N is an integer. Another technique, Fractional N, makes it possible to generate frequencies that are any rational multiple of the reference frequency. Such a technique is disclosed in U.S. Pat. No. 3,928,813 issued to Charles A. Kingsford-Smith on Dec. 23, 1975, entitled, "Device for Synthesizing Frequencies which are Rational Multiples of a Fundamental Frequency."

In a given application, it is often desired to frequency modulate (FM) the synthesized signal. A PLL is in effect a control system that maintains a constant phase difference between two signals. Any variations in the phase of one signal relative to the other are removed by the PLL. This property of a PLL is utilized to suppress noise and clean up a signal, however, this property also tends to suppress any frequency modulation, of the PLL output.

Audio FM may be accomplished by splitting the FM signal into two separate signal paths. One path is AC coupled to the VCO and will be the primary path for the FM signal for frequencies that are above the bandwidth of the PLL. FM at frequencies inside the PLL bandwidth is integrated and then injected into a summing node at the output of the phase detector. Since phase is the integral of frequency, FM at frequencies within the PLL bandwidth is accomplished by phase modulation (PM). Properly scaling the gains of each signal path provides flat FM response both inside and outside the PLL bandwidth. The above technique is often employed to accomplish FM in PLLs, however, it has some important limitations.

There are two characteristics which place inherent limits on the amount of frequency deviation from the center frequency that is obtainable in a PLL. First, phase detectors typically operate linearly only over a range of a few degrees or a small fraction of a radian. This forces the maximum allowed frequency deviation to be small at low modulation rates. Secondly, an integrator generally comprises an OP-AMP with a capacitor in the feedback path. Practical integrators cannot provide an output that is higher than the power supply voltage, typically ±10 to ±15 volts. This determines the maximum PM signal, further restricting the maximum FM deviation.

A typical application requires an RF signal to be frequency modulated at audio rates and at relatively high carrier frequency deviations. This application requires a large modulation index, where the modulation index is the ratio of the maximum frequency shift in the output of the VCO to the modulation rate. Usually a large modulation index is obtained by constructing a PLL with a narrow bandwidth thus allowing most of the modulation to be accomplished outside the bandwidth of the loop.

The limitation of a narrow bandwidth loop is that the stability provided by a wide bandwidth PLL is lost. Narrow bandwidth loops are also inherently noisier and more susceptible to spurs and jitter caused by external sources such as vibration than are wide bandwith loops. The ideal system for FM in a PLL would comprise a wide bandwidth loop with both a phase detector and an integrator that have infinite range.

SUMMARY OF THE INVENTION

In accordance with the present invention, the preferred embodiment provides a phase-locked loop comprising an AC coupled signal path for FM and a DC coupled signal path to integrate the FM signal thus providing phase modulation. The limitations of phase detector range, integrator range and loop bandwidth are overcome by inserting or removing one or more cycles of the VCO output from the divide-by-N block input, precisely resetting the integrator and precisely measuring the instantaneous phase deviation.

Whenever the output voltage of the integrator exceeds, positively or negatively, a preset threshold voltage level, a three-modulus prescaler removes or adds one (or) more cycles at the input to the loop divide-by-N block effectively removing or adding two pi (or integral multiples of two pi) radians of phase change to the input of the divide-by-N circuit. At the same time the integrator is reset by adding to or removing from the integrator input a precise amount of charge which exactly cancels the amount of phase which has been removed or added at the input to the divide-by-N block.

Utilizing the above technique, the frequency response of the PLL may be extended down to DC. The only limitation is the amount of deviation achievable by removing or adding pulses during each reference period. The frequency accuracy of the system is limited by the offset voltages and leakage currents of the audio signal path. The VCO remains phase-locked providing the noise clean up characteristics inherent in PLLs.

The above system cannot lock the center frequency of the VCO to the reference frequency or synthesize the center frequency of the VCO output because any offset currents at the integrator translate into a center frequency shift. To keep the center frequency from drifting, DC feedback around the integrating OP-AMP is added. Also a counter and a digital to analog converter (DAC) are utilized to feed back a signal proportional to the number of pulses added or removed, thereby feeding back a signal proportional to the exact instantaneous phase deviation.

The aove feedback technique provides a true synthesized center frequency with no drift while allowing high deviation and an arbitrary placement of the lower 3 db frequency. When the pulse counter, DAC and DC feedback is turned off, DC FM is provided.

DESCRIPTION OF THE PREFERRED EMBODIMENT

Figure 1:
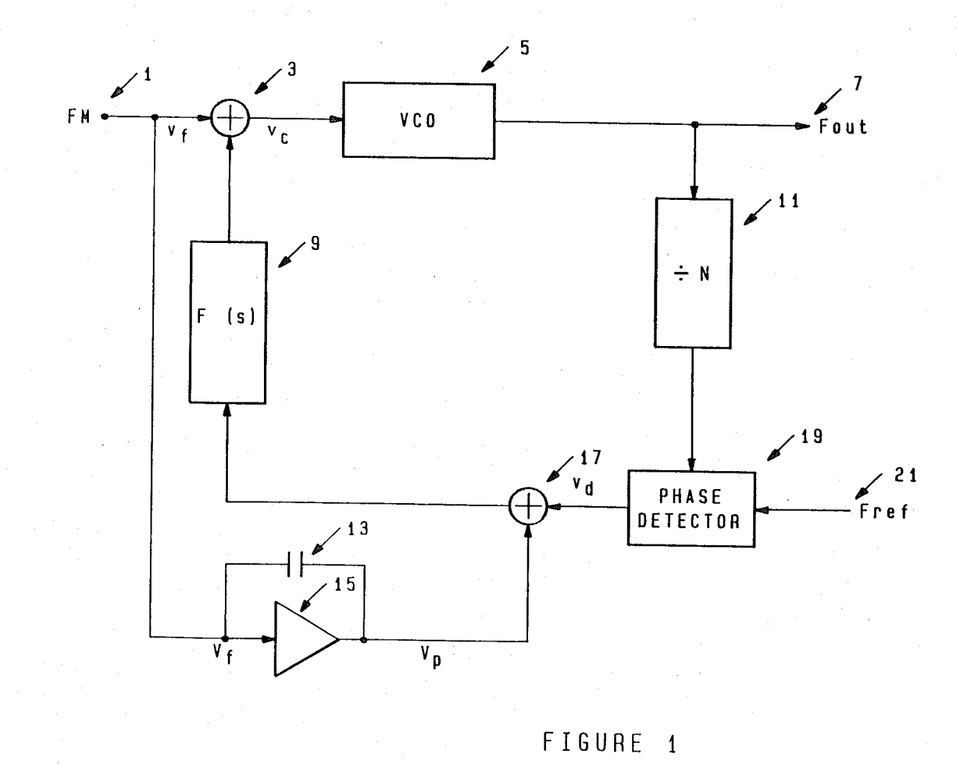
FIG. 1 is a block diagram illustrating a prior art FM phase-locked loop.

Referring to FIG. 1, a prior art FM phase-locked loop (PLL) comprises a voltage-controlled tunable oscillator (VCO) 5, a phase detector 19 and a loop filter 9 having a transfer function F(s). The summing block 3 sums the FM signal input at 1 with the output of the loop filter 9 and inputs the control voltage $v_c$ to the VCO 5. The divide-by-N block 11 is a frequency divider which divides the output frequency, $F_{out}$ 7, by some number N prior to comparing the output signal phase $\phi_o$ to the phase $\phi_i$ of a reference signal 21 in the phase detector 19. The output of the phase detector 19 is a voltage $v_d$ that is proportional to the difference in phase between its inputs:

$$v_d = K_d(\phi_i - \phi_o)$$

where $K_d$ is the phase detector gain factor.

OP-AMP 15 and capacitor 13 form an integrator that integrates the FM input signal 1 and provides a phase modulation (PM) voltage $V_p$ to the summing block 17.

The output frequency of the VCO 5 is determined by the control voltage $V_c$. Deviation of the VCO from its center frequency is $W = K_o V_c$ where $K_o$ is the VCO gain factor. Since frequency is the derivative of phase, the VCO operation may be described as $$d\phi_o/dt = K_o V_c$$

and taking Laplace transforms $$\phi_o(s) = K_o V_c(s)/s$$

and the phase modulation caused by the voltage $V_p$ is $$\phi_o(s) = \frac{K_o F(s) V_p(s)}{s + \frac{K_o K_d F(s)}{N}}$$

where $\phi_i$ is assumed to be constant.

Since output frequency modulation is the derivative of phase $$W(s) = s\phi_o(s)$$

and $$W(s) = \frac{s K_o F(s) V_p(s)}{s + \frac{K_o K_d F(s)}{N}}$$

Frequency modulation produced by adding an FM voltage $V_f$ into the summing block 3 gives $$\phi_o(s) = \frac{K_o V_f(s)}{s + \frac{K_o K_d F(s)}{N}}$$

and $$W(s) = \frac{s K_o V_f(s)}{s + \frac{K_o K_d(s)}{N}}$$

If $V_p(s)$ is given by $$V_p(s) = V_f(s) k_i/s$$

where $K_i$ is the gain of the integrator 13 and 15 then the composite response of the loop is $$W(s) = \frac{s K_o V_f(s)}{s + \frac{K_o K_d F(s)}{N}} + \frac{s F(s) K_o V_f(s) K_i/s}{s + \frac{K_o K_d F(s)}{N}}$$

Figure 2:
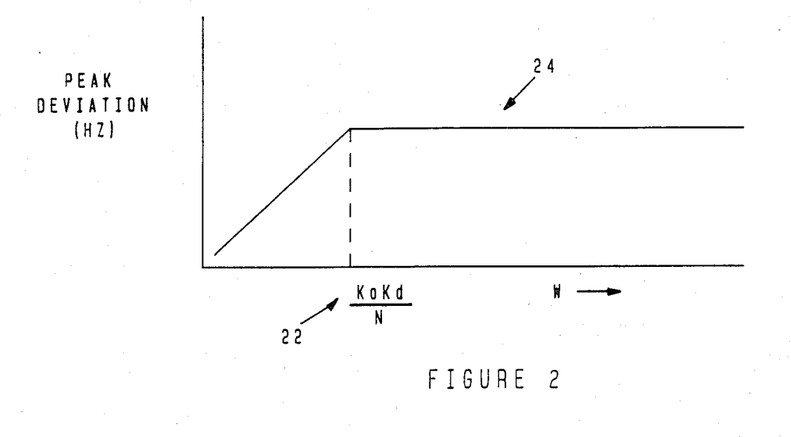
FIG. 2 is a plot of the FM response of the phase-locked loop illustrated in FIG. 1 with the integrator path removed.
Figure 3:
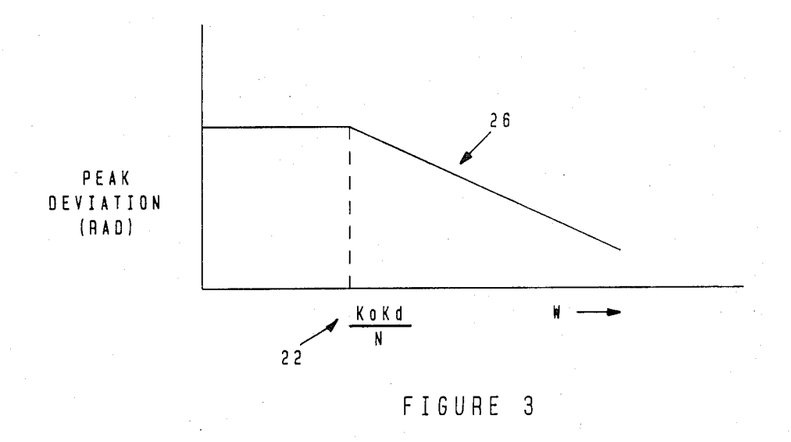
FIG. 3 is a plot of the PM response of the phase-locked loop illustrated in FIG. 1 with the integrator path only.

Referring to FIG. 2, curve 24 illustrates that FM response of the PLL is in effect a highpass filter passing radian frequencies higher than the loop bandwidth 22 and attenuating signals lower than the loop bandwidth 22. Referring to FIG. 3, curve 26 illustrates that the PM response of the PLL is in effect a lowpass filter, passing signals within the loop bandwith 22 and attenuating signals outside the loop bandwidth 22.

In the simple case where F(s)=1 the loop bandwidth is $K_o K_d/N$. Scaling the integrator gain $K_i$ so that $$K_i = K_o K_d/N$$

provides flat FM response both inside and outside the loop bandwidth.

Figure 4:
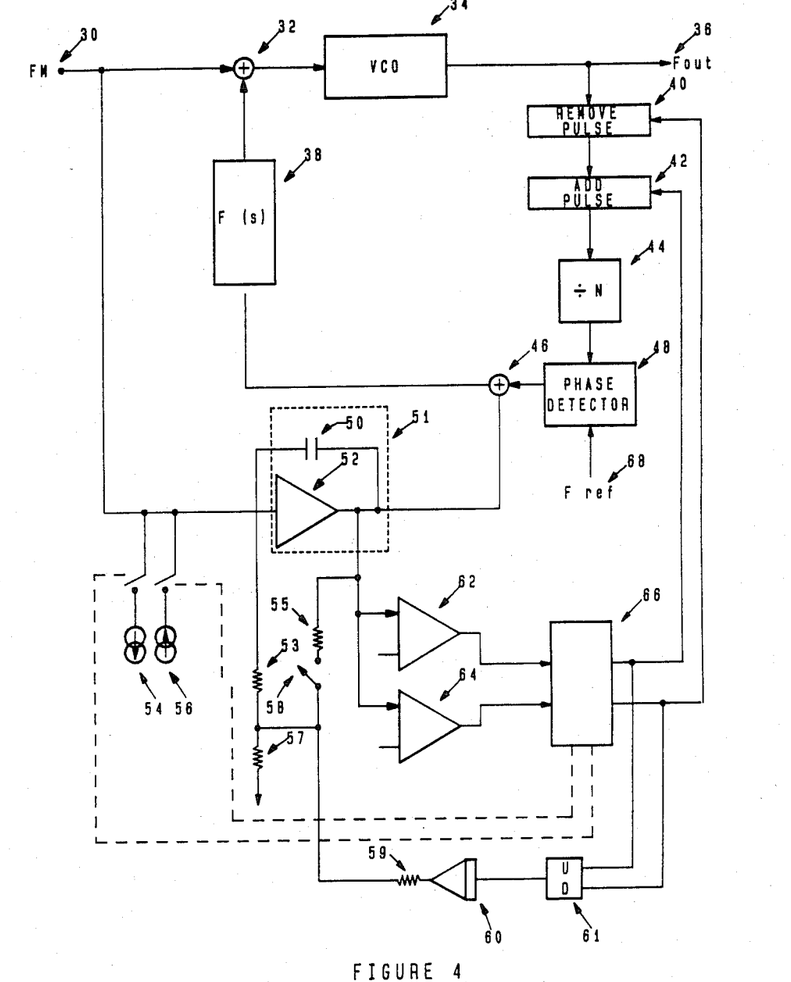
FIG. 4 is a block diagram illustrating an FM phase-locked loop in accordance with the present invention.

FIG. 4 is a block diagram of the preferred embodiment in accordance with the present invention. The basic phase-locked loop (PLL) is the same as in the prior art illustrated in FIG. 1. OP-AMP 52 and Capacitor 50 form an integrator 51. The integrator 51 operates on the FM input voltage 30. Whenever the integrator 51 output crosses an arbitrary high threshold, a comparator 62 detects the crossing and outputs a high threshold pulse. Whenever the integrator 51 output crosses an arbitrary low threshold, another comparator 64 detects the crossing and outputs a low threshold pulse. The high threshold and low threshold pulses, after some sequencing logic 66, cause a pulse to be removed 40 or a pulse to be added 42 to the input of the divide-by-N counter 44. The pulse remove 40 and pulse add 42 comprise a prescaler which is essentially a six-bit ring counter followed by a divide-by-two circuit. In normal operation, the ring counter is set up for modulus five and is followed by the divide-by-two circuit making the divisor equal to 10. A high threshold pulse sets the ring counter to modulus six for one cycle and to modulus 5 for the next cycle resulting in a divide-by-eleven operation which removes one pulse from the input of the divide-by-N counter 44. A low threshold pulse sets the ring counter to modulus four for one cycle and to modulus five for the next cycle resulting in a divide-by-nine operation which adds a pulse to the input of the divide-by-N counter 44. The adding or removing of one pulse effectively removes two pi of accumulated phase shift from the input signal to the divide-by-N counter 44.

Whenever a pulse is added or removed, sequencing logic circuits 66 turn on a source 56 or 54 to pump a precise amount of charge into the integrator 51 summing node to offset the two pi phase change in the 44 input and resetting the integrator.

When operating as outlined above, the PLL provides DC coupled FM. Since zero drift integrators are not realizable, the PLL will display an offset from center frequency even when no voltage is present at the input.

Since any offset currents at the integrator input translate into a center frequency shift, it is necessary to move the integrator pole away form DC by adding DC feedback around the integrating OP-AMP to keep it from drifting. The resetting and pulse remove/add action makes the integrator inherently nonlinear. To reconstruct linear operation from the circuitry a signal that is proportional to the true instantaneous phase shift at the VCO 34 is fed back to the integrator 51.

Typically a feedback resistor is placed in parallel with the integrator capacitor 50. Modulation requirements mandate that the integrator 51 pole be at a very low frequency which requires an impractically high value for the feedback resistor. The resistive voltage divider comprised of resistors 53, 55 and 57 form a DC feedback path with the necessary voltage to current conversion factor. Up/down counter 61 and digital-to-analog converter (DAC) 60 along with resistors 53, 57 and 59 provide a current feedback that is proportional to the total number of pulses added or removed from the output of the VCO 34.

Switch 58 provides true DC coupled FM by interrupting the DC feedback path from the output of the integrator 51 to the input of the integrator. When switch 58 is opened, a count enable signal at the up/down counter 61 disables the counter, and the output frequency of the PLL can be varied by a DC voltage input while the PLL, in effect, remains locked to the reference frequency. Closing the switch 61 provides AC coupled FM of a true synthesized center frequency.

The technique disclosed above provides arbitrary integrator pole placement while also providing large deviation from the center frequency. A ten-bit DAC and up/down counter will provide a total deviation of plus or minus 512 counts, each count corresponding to two pi radians of phase.

Figure 5:
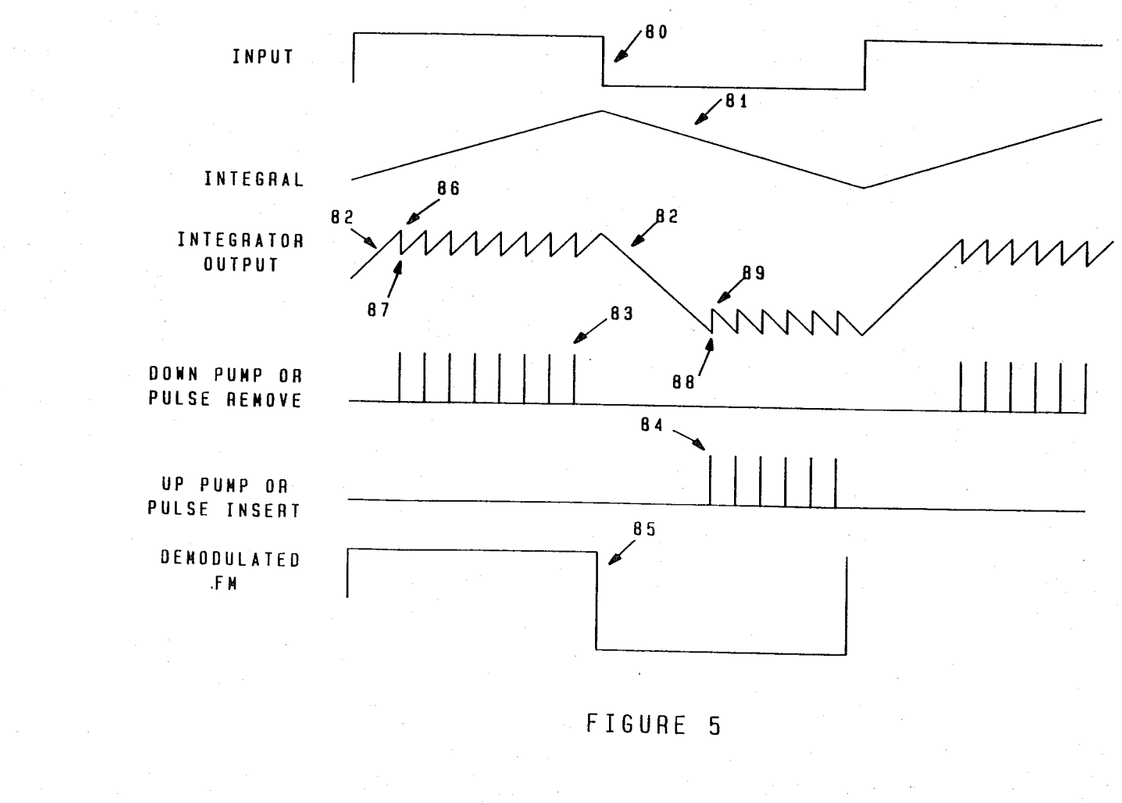
FIG. 5 illustrates various waveforms involved in the pulse removal and pulse addition in the phase-locked loop illustrated in FIG. 4.

Referring now to FIGS. 4 and 5, in the DC coupled FM mode, the operation is as follows: for a square wave input 80, the output of the ideal integrator would be triangle wave 81. When the output 82 of the integrator 51 increases to a preset high threshold 86, comparator 62 outputs a pulse remove signal 83 and the sequencing logic circuits 66 turn on current source 56 to pump a precise amount of charge into the integrator 51 to reset the integrator output 87. When the input signal 80 goes negative, the integrator 51 output 82 increases in a negative direction to a preset low threshold 88, comparator 64 outputs a pulse add signal 84 and the sequencing logic circuits 66 turn on current source 54 to reset the integrator output 89.

Figure 6:
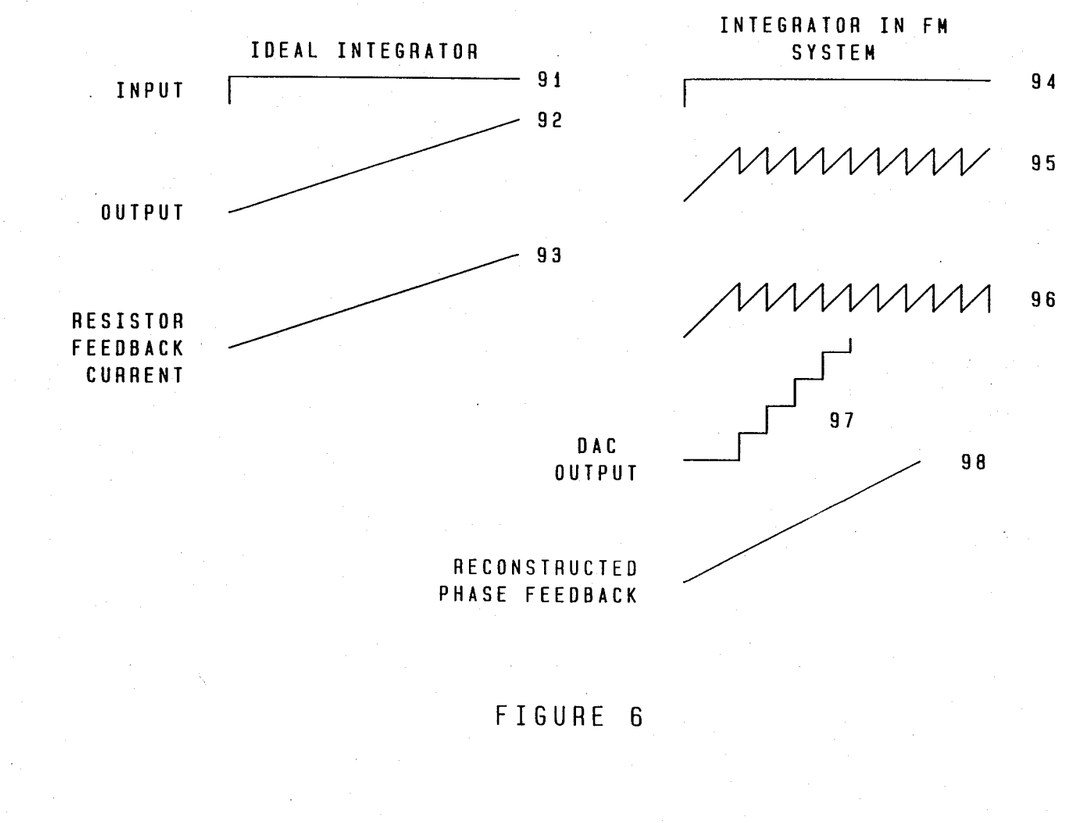
FIG. 6 illustrates various waveforms involved in the integrator feedback in the phase-locked loop illustrated in FIG. 4.

Referring now to FIGS. 4 and 6, in the AC coupled FM mode, the operation is as follows: for a constant input signal 91, the output 92 of the ideal integrator is a constantly increasing ramp and the DC feedback current 93 is also a constantly increasing ramp. For the integrator 51 in the PLL of FIG. 4, a constant input signal 94 produces an output voltage 95 that is reset everytime the high threshold value is crossed. The DC feedback current 96 is a sawtooth wave that follows the integrator output voltage 95. The current output of the DAC 60 is a stair step wave 97. The resistive network comprised of resistors 53, 55, 57 and 59 sum the two feedback currents 96 and 97 to produce a reconstructed phase feedback current 98 that matches the DC feedback 93 in the ideal integrator. The feedback current can be considered a current proportional to the instantaneous phase offset at the output of the VCO 34.

While the invention has been described and shown with reference to a preferred embodiment thereof, it will be understood by those skilled in the art that various changes in form and details may be made thereto without departing from the spirit and scope of the invention.

We claim:

1. An electronic apparatus for frequency modulation of a multiplicity of frequencies which are desired rational multiples of a reference frequency generated in a phase-locked loop, said apparatus comprising:

frequency generating means for producing an output signal with a frequency responsive to the level of a control input signal;

first counting means responsive to the output of the frequency generating means for producing an output signal with a frequency equal to the frequency of a signal at the input of the first counting means divided by N;

phase comparison means coupled to the first counting means for comparing the phases of the output signal from the first counting means and a reference signal and generating an error signal indicative of a phase difference therebetween, said error signal serving as the control input signal to the frequency generating means to thereby vary the frequency of the output signal from the frequency generating means;

integrating means coupled to the output of the phase comparison means for integrating a frequency modulation input signal and producing an output signal which is summed with said error signal thereby phase modulating the output signal from the frequency generating means;

input means for summing said frequency modulation signal with the control input signal for producing frequency modulation of the output signal from the frequency generating means;

first comparator means coupled to the output of the integrating means for comparing the output of the integrating means to a predetermined arbitrary first voltage level for producing a high threshold pulse whenever the output of the integrating means exceeds said first voltage level;

second comparator means coupled to the output of the integrating means for comparing the output of the integrating means to a predetermined arbitrary second voltage level, said first voltage level greater than said second voltage level, for producing a low threshold pulse whenever the output of the integrating means is less than said second voltage level;

cycle removal means interconnected between the frequency generating means and the first counting means, said cycle removal means responsive to the high threshold pulse to remove at least one cycle from the input of the first counting means thereby removing a multiple of two pi radians of accumulated phase shift from the input signal to the first counting means;

cycle addition means interconnected between the frequency generating means and the first counting means, said cycle addition means responsive to the low threshold pulse to add at least one cycle to the input of the first counting means for adding a multiple of two pi radians of accumulated phase shift to the input signal to the counting means;

first current generating means coupled to the input of the integrating means responsive to the high threshold pulse for inputting a reset current into the integrating means input to reset the output of the integrating means a predetermined amount below said predetermined first voltage level, said predetermined amount cancelling exactly said multiple of two pi radians of phase shift removed from the input signal to the first counting means; and second current generating means coupled to the input of the integrating means responsive to the low threshold pulse for inputting a reset current into the integrating means input to reset the output of the integrating means a predetermined amount above said predetermined second voltage level, said predetermined amount cancelling exactly said multiple of two pi radians of phase shift added to the input signal to the first counting means.

2. Apparatus as in claim 1 further comprising a loop filter means interconnected between the output of the phase comparison means and the input of the frequency generating means for removing undesirable components from said error signal.

3. Apparatus as in claim 2 wherein said cycle removal means and said cycle addition means comprise a three-modulus prescaler.

4. Apparatus as in claim 3 wherein said prescaler comprises a six-bit ring counter coupled to a divide-by-two flip-flop.

5. An electronic apparatus for frequency modulation of a multiplicity of frequencies which are desired rational multiples of a reference frequency generated in a phase-locked loop, said apparatus comprising:

frequency generating means for producing an output signal with frequency responsive to the level of a control input signal;

first counting means responsive to the output of the frequency generating means for producing an output signal with a frequency equal to the frequency of a signal at the input of the first counting means divided by a predetermined divisor N;

phase comparison means coupled to the first counting means for comparing the phases of the output signal from the first counting means and the reference signal and generating an error signal indicative of a phase difference therebetween, said error signal serving as the control input signal to the frequency generating means to thereby vary the frequency of the output signal from the frequency generating means;

integrating means coupled to the output of the phase comparison means for integrating a frequency modulation input signal and producing an output signal which is summed with said error signal thereby phase modulating the output signal from the frequency generating means;

input means for summing said frequency modulation signal with the control input signal for producing frequency modulation of the output signal from the frequency generating means;

first comparator means coupled to the output of the integrating means for comparing the output of the integrating means to a predetermined arbitrary first voltage level for producing a high threshold pulse whenever the output of the integrating means exceeds said first voltage level;

second comparator means coupled to the output of the integrating means for comparing the output of the integrating means to a predetermined arbitrary second voltage level, said first voltage level greater than said second voltage level for producing a low threshold pulse whenever the output of the integrating means is less than said second voltage level;

cycle removal means interconnected between the frequency generating means and the first counting means, said cycle removal means responsive to the high threshold pulse to remove at least one cycle from the input of the first counting means thereby removing a multiple of two pi radians of accumulated phase shift from the input signal to the first counting means;

cycle addition means interconnected between the frequency generating means and the first counting means, said cycle addition means responsive to the low threshold pulse to add at least one cycle to the input of the first counting means for adding a multiple of two pi radians of accumulated phase shift to the input signal to the counting means;

first current generating means coupled to the input of the integrating means responsive to the high threshold pulse for inputting a reset current into the integrating means input to reset the output of the integrating means a predetermined amount below said predetermined first voltage level, said predetermined amount cancelling exactly said multiple of two pi radians of phase shift removed from the input signal to the first counting means; and second current generating means coupled to the input of the integrating means responsive to the low threshold pulse for inputting a reset current into the integrating means input to reset the output of the integrating means a predetermined amount above said predetermined second voltage level, said predetermined amount cancelling exactly said multiple of two pi radians of phase shift added to the input signal to the first counting means;

second counting means responsive to the high threshold pulses and the low threshold pulses for producing a digital signal indicative of the net number of cycles added to and removed from the input to the first counting means;

digital-to-analog converter means coupled to the second counting means and responsive to said digital signal for producing a voltage signal proportional to the net number of cycles removed from and added to the input of the first counting means;

resistive feedback means coupled to the output of the integrating means and the output of the digital-to-analog converter means and to the input of the integrating means, said resistive feedback means responsive to the output of the integrating means and the output of the digital-to-analog means for producing a feedback current to the input of the integrating means, said feedback current proportional to the amount of phase that the output of the frequency generating means is away from the center frequency of the output of the frequency generating means; and switching means disposed between the resistive feedback means and the input of the integrating means for interrupting said feedback current path.

6. Apparatus as in claim 5 further comprising a loop filter means interconnected between the output of the phase comparison means and the input of the frequency generating means for removing undesirable components from said error signal.

7. Apparatus as in claim 6 wherein said cycle removal means and said cycle additional means comprise a three-modulus prescaler.

8. Apparatus as in claim 7 wherein said prescaler comprises a six-bit ring counter coupled to a divide-by-two flip-flop.

9. Apparatus as in claim 6 wherein said second counting means comprises an up/down counter.

* * * * *